US006542025B1

(12) United States Patent
Kutz et al.

(10) Patent No.: US 6,542,025 B1
(45) Date of Patent: Apr. 1, 2003

(54) POWER SUPPLY PUMP CIRCUIT FOR A MICROCONTROLLER

(75) Inventors: Harold Kutz, Snoqoulmie, WA (US); Warren Snyder, Snohomish, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/922,419

(22) Filed: Aug. 3, 2001

Related U.S. Application Data

(60) Provisional application No. 60/243,708, filed on Oct. 26, 2000.

(51) Int. Cl.$^7$ ................................................ G05F 1/10
(52) U.S. Cl. ....................................................... 327/536
(58) Field of Search ................................ 327/530, 534, 327/536, 537

(56) References Cited

U.S. PATENT DOCUMENTS 5,808,883 A * 9/1998 Hawkes ........................ 363/60
5,949,632 A * 9/1999 Barreras et al. ............... 361/90

\* cited by examiner

Primary Examiner—Jeffrey Zweizig
(74) Attorney, Agent, or Firm—Wagner, Murabito & Hao LLP

(57) ABSTRACT

A method and a system for supplying power to a microcontroller with a single cell battery. A power supply pump circuit may be incorporated with the microcontroller having dynamic interaction. The microcontroller sends its power requirements to the power supply pump circuit and in response, the power supply pump circuit controls the operating voltage with optimal efficiency. The dynamic update of power supply pump circuit results in an efficient use of the power supply pump circuit and thus results in a reduction of the number of dry cell batteries to only a single cell. Incorporation of the microcontroller and power supply pump circuit onto a single chip reduces the pin number requirements as well as the space required on the printed circuit board.

21 Claims, 5 Drawing Sheets

500

```
┌─────────────────────────────────────────────┐
│ INITIAL OPERATING VOLTAGE IS GENERATED BY   │
│ CONNECTING A PASSIVE PRECHARGE CIRCUIT TO A │
│              BATTERY CIRCUIT                │
│                    510                      │
└─────────────────────────────────────────────┘
                       │
┌─────────────────────────────────────────────┐
│ INITIAL OPERATION OF A DRIVE ENABLE CIRCUIT, A │
│ VOLTAGE SENSOR CIRCUIT, A RING OSCILLATOR   │
│ CIRCUIT, AND A GATE DRIVE BOOST CIRCUIT IS  │
│ INITIATED AT THE INITIAL OPERATING VOLTAGE  │
│                    520                      │
└─────────────────────────────────────────────┘
                       │
┌─────────────────────────────────────────────┐
│    INITIAL OPERATING VOLTAGE IS BOOSTED TO A│
│       MINIMUM OPERATING VOLTAGE OF          │
│              MICROCONTROLLER                │
│                    530                      │
└─────────────────────────────────────────────┘
                       │
┌─────────────────────────────────────────────┐
│  MONITORING THE MICROCONTROLLER'S MINIMUM   │
│  OPERATING VOLTAGE USING A VOLTAGE SENSOR   │
│  DEVICE AND INCREASING THE MINIMUM OPERATING│
│  VOLTAGE TO A VOLTAGE LEVEL DEMANDED BY THE │
│              MICROCONTROLLER                │
│                    540                      │
└─────────────────────────────────────────────┘
```

FIGURE 5

POWER SUPPLY PUMP CIRCUIT FOR A MICROCONTROLLER

RELATED U.S. APPLICATION

This Application claims priority to the abandoned provisional patent application Serial No. 60/243,708, entitled "ADVANCED PROGRAMMABLE MICROCONTROLLER DEVICE", with filing date Oct. 26, 2000, and assigned to the assignee of the present application.

FIELD OF INVENTION

The present invention relates to the field of power supplies for integrated circuits. More specifically an embodiment of the present invention relates to a power supply pump circuits used to power microcontrollers.

BACKGROUND OF THE INVENTION

A controller is generally a device used to control other processes or external devices. A microcontroller is an electronic device, a highly integrated chip, which performs controlling functions. A microcontroller includes all or most of the parts needed for implementing a controller but physically, is a smaller device (e.g., and integrated circuit). The demands for reduction in the size of microcontrollers, due to the nature of their use, have led to the miniaturization of the electronic components constituting a microcontroller. The reduction in the physical size of microcontrollers has caused an increase in the scope of their use across different fields. The spectrum of the application of microcontrollers varies across different and diverse disciplines. For example, microcontrollers are being used in the field of medicine, for example a pacemaker monitoring a patient's heart beats, or in the field of meteorology, where a microcontroller is installed in a very remote location to periodically record, log and report atmospheric conditions. In many instances more than one microcontroller is found in a single device to perform a certain function. In today's technology, almost all electrical and electromechanical devices use microcontrollers for the purpose of controlling or monitoring different processes.

Microcontrollers require a source of power for their operation. Most microcontrollers only support 4.5 to 5 volts operations and thus require a power source capable of supplying that amount of power. Dry cell batteries are typically used to support a microcontroller's power demand. To meet such power requirements, generally 2–3 dry cells (i.e., type AAA) power the microcontrollers. Comparing the size of electronic components used in a typical microcontroller and the batteries used to power the device, the batteries are the most voluminous component in a microcontroller. With the ever increasing demand for reduction in the size of microcontrollers,-a need exist to reduce the size of the power supply providing power to the microcontrollers.

Effort should be made to conserve energy during all modes of operation. A typical microcontroller does not operate on a continuous basis, the device is generally programmed to operate based on the demand or in accordance with a programmed schedule. Once the microcontroller performs its function it either goes to an idle mode or to a sleep mode until it is summoned to perform another function. It is during the performance of a function, during operational mode, that a microcontroller requires more power to meet its operating voltage requirements. A microcontroller has a much lower power requirement during its idle or sleep mode than when it is performing a function. For example, a microcontroller which is installed in a remote location to measure environmental data at some regular interval need not be in its operational mode at all times. The microcontroller may be in its sleep mode most of the time, except when it has to take the environmental data measurements. When measurements are required, the microcontroller wakes up, takes the measurements, logs the data and then goes to sleep. A microcontroller may be placed in a halt mode, where all activities are ceased and it has no power requirements. The only way to wake up the device is by reset or by device interrupt. For example, in a laptop keyboard, where power saving is required, the microcontroller is in halt mode until it detects a keystroke. When the microcontroller detects a keystroke, it wakes up, its mode changes from sleep mode to operation mode. Therefore an efficient method is needed to supply a microcontroller with power on demand and conserve power when the microcontroller is in sleep or idle mode.

Board space on a typical Printed Circuit Board (PCB) is limited, thus efforts should be made to optimize foot prints of the devices used and the number of pins for inter connection. The present generation of microcontrollers, requiring operating voltage of 4.5–5 volts, uses fewer battery cells than prior generations in order to perform the same or a similar function. To supply the operating voltage requirements with a smaller number of dry cells, a separate power supply pump circuit is used to boost the relatively lower supplied voltage value to the required operating voltage value. A separate power supply pump circuit meets the demand of a microcontroller as far as the operating voltage is concerned, but such a power supply pump circuit has its own disadvantages. A separate power supply pump circuit requires additional space on the printed circuit board (PCB) and additional pins for interconnections. Space on the PCB for any device and pin connections are scarce commodities and efforts are always made to optimize such requirements. Minimizing the space requirements and reducing the number of pins for the interconnection of devices are needs to be addressed by designers and manufacturers.

To efficiently conserve power, a continuous interaction between a microcontroller and its power supply pump circuit is necessary. Such an interaction includes the microcontroller informing the power supply pump circuit of its power demands and the power supply pump circuit supplying the required power when the power is needed. Conventional power supply pump circuits communicate with microcontroller and supply power to the microprocessor based on the microprocessor's power demand. However, the very process of communicating (e.g., driving input and output pins) decreases the efficiency of power conservation. Optimal operation of a microcontroller requires efficient communication between the power supply pump circuits and the microcontrollers.

SUMMARY OF THE INVENTION

Therefore, a need exists to minimize the space required by the batteries supplying power to the microcontrollers. Also, a need exist to optimize the efficiency of the communication between the microcontroller and the power supply pump circuit in order to conserve the energy requirements of the microcontrollers. Another need exist to reduce the space required by the power supply pump circuit and the microcontroller on the PCB and to minimize the number of pins required to interconnect these devices. Still another need exist to maintain the microcontroller with minimum amount of power consumption during its sleep mode. The present invention provides a novel solution to these requirements Accordingly, an embodiment of the present invention reduces the size of a power supply pump circuit by reducing a number of battery cells used to supply power to a device. Also, the efficiency of communication between a microcontroller and the power supply pump circuit is increased when both the power supply pump circuit and the microcontroller are integrated into one circuit and are housed in a single chip. Furthermore, integrating the power supply pump circuit and the microcontroller causes a foot print reduction on the PCB, thus satisfies the reduced space requirements, and reduces the number of pins used for interconnection. This invention further optimizes the system's power consumption due to the dynamic interaction between the two devices (e.g., the microcontroller and the power supply pump circuit). The exchange of information regarding the microcontroller's power requirements optimizes power consumption by the microcontroller and allows near zero power consumption when the microcontroller is in a sleep mode.

These and other objects and advantages of the present invention will no doubt become obvious to those of ordinary skill in the art after having read the following detailed description of the preferred embodiment which are illustrated in the various drawing figures.

A method and a system for supplying power to a microcontroller with a single cell battery are disclosed. One embodiment of the present invention discloses incorporation of a power supply pump circuit with the microcontroller and their dynamic interaction. The microcontroller sends its power requirements to the power supply pump circuit and in response, the power supply pump circuit controls the operating voltage with optimal efficiency. The dynamic update of power supply pump circuit results in an efficient use of the power supply pump circuit and thus results in a reduction of the number of dry cell batteries to only a single cell. Incorporation of the microcontroller and power supply pump circuit onto a single chip reduces the pin number requirements as well as the space required on the printed circuit board.

A method and a system for providing a power supply pump circuit to supply power to a microcontroller. The power supply pump is a part of the microcontroller and the microcontroller dynamically interacts with the power supply pump circuit. A battery initiates a supply of power comprising a certain initial voltage to the power supply pump circuit. This initial voltage establishes a default operating voltage for the power supply pump. A voltage sensor senses the default operating voltage value of the power supply pump circuit. The voltage sensor is a programmable device, and dynamically interacts with the microcontroller to receive power requirements of the microcontroller. The voltage sensor updates the operating voltage value in accordance with the power requirements of the microcontroller. A drive enable receives the operating voltage value from the voltage sensor and maintains the operating voltage value. The power supply pump also includes a gate drive boost circuit. The gate drive boost circuit is configured to receive commands from the drive enable circuit and to fluctuate the operating voltage value according to the commands received from the drive enable circuit. The drive enable circuit regulates the fluctuation of the operating voltage value in accordance with changes in the power requirements of the microcontroller. A passive precharge circuit drives the power supply pump before the voltage sensor and the drive enable begin their normal operation.

A method and a system for supplying power to a microcontroller with a single cell battery are disclosed. One embodiment of the present invention discloses the incorporation of a power supply pump circuit with the microcontroller and their dynamic interaction. The microcontroller sends its power requirements to the power supply pump circuit, and in response, the power supply pump circuit controls the operating voltage with optimal efficiency. The dynamic update of power supply pump circuit results in an efficient use of the power supply pump circuit, and consequently, a reduction of the number of batteries to only a single cell battery. Incorporation of the microcontroller and power supply pump circuit onto a single chip reduces the number of pins required for connectivity as well as the space required on the printed circuit board.

BRIEF DESCRIPTION OF THE DRAWINGS

The accompanying drawings, which are incorporated in and form a part of this specification, illustrate embodiment of the invention and, together with the description, serve to explain the principles of the invention:

FIG. 5 is a flowchart of the steps in a process of initiating power supply pump operation with a single cell.

DETAILED DESCRIPTION OF THE PREFERRED EMBODIMENTS

Reference will now be made in detail to preferred embodiment of the invention, a power supply pump circuit for a microcontroller circuit, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specified details are set forth in order to provide a thorough understanding of the present invention. However, it will be obvious to one of ordinary skill in the art that the present invention may be practiced without these specific details. In other instances, well known methods, and circuits have not been described in detail as not to unnecessarily obscure aspects of the present invention.

Figure 1:
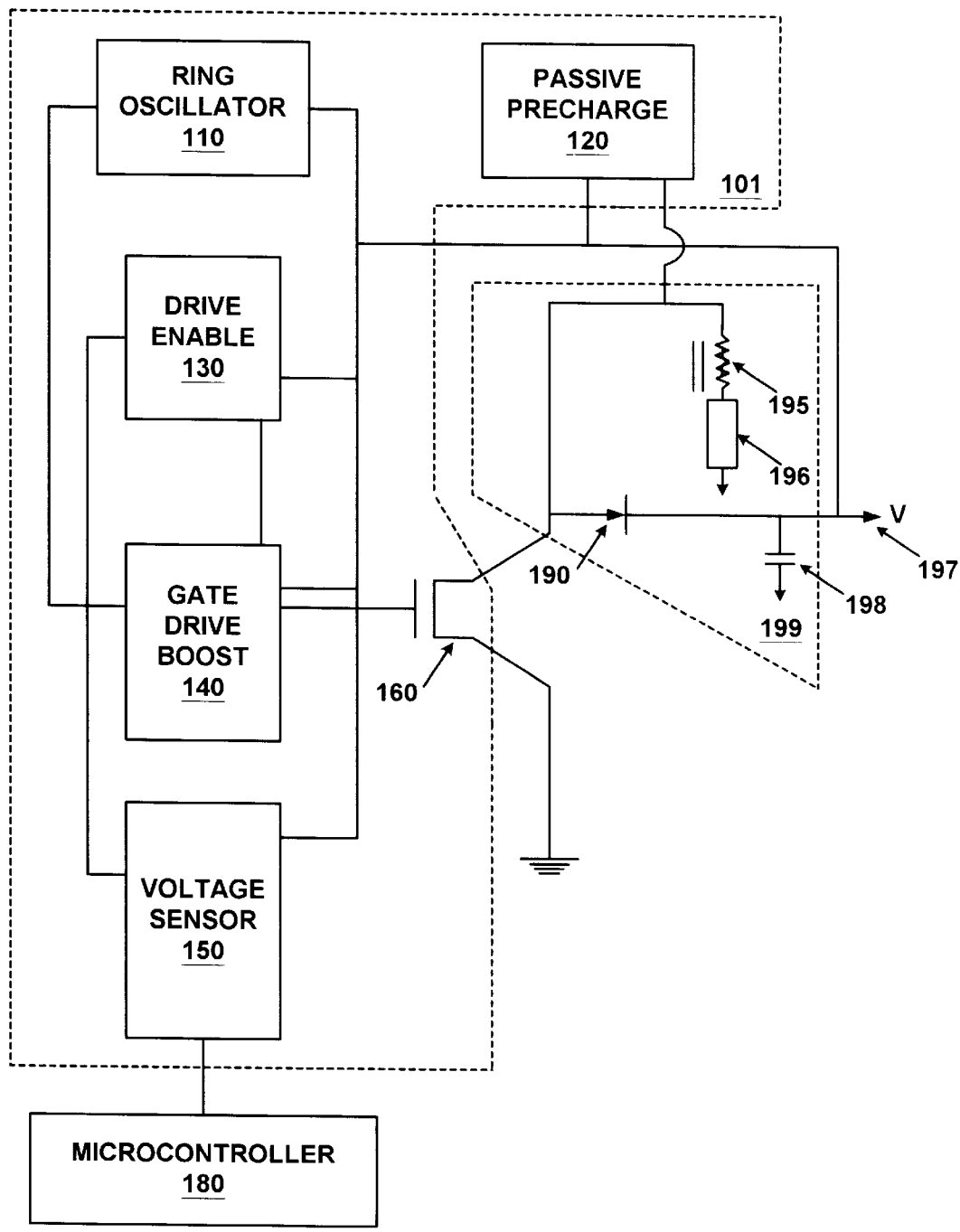
FIG. 1 is a block diagram of a typical power supply pump circuit and its interaction with a microcontroller.

FIG. 1 is a block diagram of system 100 which includes power supply pump system 101 incorporated with microcontroller 180 on a single Integrated Circuit (IC). As depicted in FIG. 1, system 101 includes a power supply pump circuit including a ring oscillator 110, a passive precharge circuit 120, a drive enable 130, a gate drive boost 140, and a voltage sensor 150. Battery circuit 199 includes a single cell battery 196, an inductor 195, a capacitor 198 and a diode 190. Diode 190 may be outside battery circuit 199. The components 110–180 are integrated "on chip" into a single integrated circuit. The components 190–198 are "off chip".

Ring oscillator 110 generates the clock signals used by logic components of system 101. Ring oscillator 110 starts operating when $V_{cc}$ 197 attains some nominal initial voltage value, in this embodiment, of approximately 1 Volt. It is appreciated that the Ring oscillator 110 operates during the sleep mode of microcontroller 180.

Passive precharge 120 causes the single cell battery 196 to operate for a short period of time, until $V_{cc}$ 197 reaches an initial minimum voltage for effective gate drive (e.g., approximately 1 Volt). This voltage value causes interaction between all components of the power supply pump circuit 101 and the microcontroller 180, this voltage is considered as the initial operating voltage. The initial operating voltage is achieved when passive precharge 120 shorts diode 190 causing battery 196's current to flow through inductor 195 and charging capacitor 198. The current from battery 196, during a short period of time, a transitory period, charges capacitor 198 to the level that it acts as a mini battery and can run ring oscillator 110 long enough to have gate drive boost 140 to start its boosting operation. Passive precharge 120 takes itself out of the circuit as soon as $V_{cc}$ 197 is boosted to the initial operating voltage value, in this embodiment 1 Volt.

Voltage sensor 150 is a programmable device and selects the operating voltage for the power supply pump circuit. Voltage sensor 150 senses $V_{cc}$ 197 voltage after the transitory period and considers that voltage as the initial operating voltage. At this voltage level, voltage sensor 150 is enabled to interact with drive enable 130. It is appreciated that $V_{cc}$ 197 voltage is common to all devices of system 101 and battery circuit 199. When voltage sensor 150 senses the initial operating voltage of 1 volt, Power On Reset Circuit (POR), which is a circuit inside voltage sensor 150 signals the operating status of the microcontroller 180 to voltage sensor 150. This circuit is a state dependent circuit it notifies voltage sensor 150 whether the microcontroller 180 is waking up or is being initialized.

There is no interaction between voltage sensor circuit 150 and microcontroller 180 at voltages below the minimum operating voltage of microcontroller 180. However, interaction between power supply pump circuit 150 and microcontroller 180 commences immediately after the minimum operating voltage of microcontroller 180 is reached. At this voltage level microcontroller 180 configures voltage sensor 150 of its desired parameters including its minimum operating voltage and its future voltage requirements. On the other hand, POR has also notified voltage sensor circuit 150 of microcontroller 180's operating status.

If microcontroller 180 is being initialized, voltage sensor 150 request an increase in initial operating voltage from drive enable 130. Drive enable 130 commands gate drive boost 140 to start the boosting operation and to continue the boosting operation until drive enable 130 sends a subsequent command to stop the boosting operation. Drive enable 130 sends a command to gate drive boost 140 to stop boosting operation when drive enable 130 is notified by voltage sensor 150 that the minimum operating voltage of the microcontroller 180 has been reached. Microcontroller 180 starts its dynamic interaction with voltage sensor circuit 150 and configures voltage sensor 150 to its desired parameters.

From this point on voltage sensor 150 notifies drive enable 130 of microprocessor 180's voltage requirements and drive enable 130 commands gate drive boost 140 to maintain the required voltage. Gate drive boost 140 receives the voltage requirements from drive enable 130 and fluctuates the voltage by changing the duty cycle of transistor 160 as required. Gate drive boost 140 functions by turning transistor 160 on or off. When transistor 160 is off the current flows into diode 190 and capacitor 198. Capacitor 198 integrates current into voltage and voltage starts to ramp up. The ramp rate is controlled by the duty cycle of transistor 160, and is the ratio of transistor 160's off time to on time For example, during a start up, Passive Precharge circuit 120 sets $V_{cc}$ 197 equal to 1 Volt. $V_{cc}$ 197 voltage of 1 Volt is common to all devices included in power supply system 101. When the voltage reaches the minimum operating voltage of microprocessor 180, dynamic interaction between voltage sensor 150 and microcontroller 180 begins and microcontroller 180 configures voltage sensor 150 with its voltage requirements.

Gate drive boost 140 receives operating voltage requirements from drive enable 130. Gate drive boost 140 increases the operating voltage by controlling transistor 160. Gate drive boost functions by turning transistor 160 on or off. When transistor 160 is off the current flows into diode 190 and capacitor 198. Capacitor 198 integrates current into voltage and voltage starts to ramp up. The ramp rate is controlled by the duty cycle of transistor 160, and is the ratio of transistor 160's off time to on time.

In one embodiment of the present invention, the minimum operating voltage of microcontroller 180 is 2.7 volts. drive enable 130 commands gate drive boost 140 to start boosting operation and ramps the voltage. When microcontroller 180 senses 2.7 volts, it initiates a dynamic interaction with voltage sensor 150 and configures Voltage sensor 150 to its desired parameters. Voltage sensor 150 knowing the minimum operating voltage of microcontroller 180 and sensing the voltage value sends a command to drive enable to stop boosting operation until commanded otherwise. From this point on, voltage sensor 150 directs the operating voltage according to microcontroller 180's requirements.

Gate drive boost 140 maintains the operating voltage at 2.7 level until drive enable 130 sends another command requesting change in the operating voltage.

Figure 2:
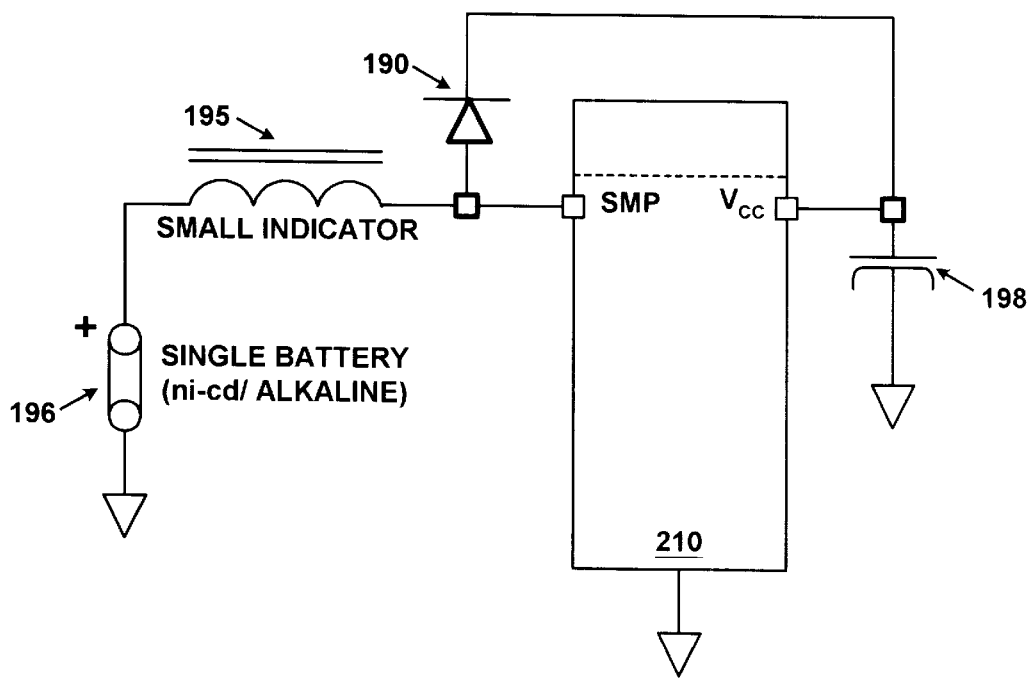
FIG. 2 is exemplary incorporation of a power supply pump circuit and a microcontroller.

FIG. 2 shows an exemplary incorporation of a power supply pump circuit 101 and microcontroller 180 in a single Integrated Circuit 210. In this embodiment of the present invention ring oscillator 110, drive enable 130, gate drive boost 140, voltage sensor 150, and microcontroller 180 are integrated into a single chip 210. In this embodiment of the present invention diode 190 is placed inside chip 210, but diode 190 could be an off chip device or in other embodiments could be eliminated.

Incorporating power supply pump circuit 101 and microcontroller 180 into a single chip improves communication between the two devices (i.e., microcontroller 180 and power supply pump circuit 100). Dynamic interaction between these devices (i.e., ring oscillator 110, drive enable 130, gate drive boost 140, voltage sensor 150) is a major factor in optimizing power consumption. Incorporating these two devices (i.e., ring oscillator 110, drive enable 130, gate drive boost 140, voltage sensor 150) into a single integrated circuit 210 of FIG. 2 will result in a more efficient communication. An other advantage of incorporating power supply pump circuit 101 and microcontroller 180 is reduction in the footprint of single integrated circuit 210 of FIG. 2 on the printed circuit board. The present invention provides a single integrated circuit 210 of FIG. 2 to take the place of a separate power supply pump circuit 101 and microcontroller 180. The present invention provides diode 190 to be integrated inside single integrated circuit 210 of FIG. 2, outside as depicted in FIG. 2 or could be completely left out. Leaving diode 190 outside single integrated circuit 210 of FIG. 2 improves the performance of the circuit and is also more cost effective, because a higher quality and a less expensive diode could be used. Furthermore, a single discrete power supply pump circuit 101 has to have a voltage sensor which in and itself consume a fair amount of power. Integration of these A devices into a single integrated circuit 210 of FIG. 2 eliminates such an unnecessary use of power.

Another advantage of this embodiment of the present invention is that $V_{cc}$ 197 can provide power to devices on the printed circuit board external to system 100.

Figure 3:
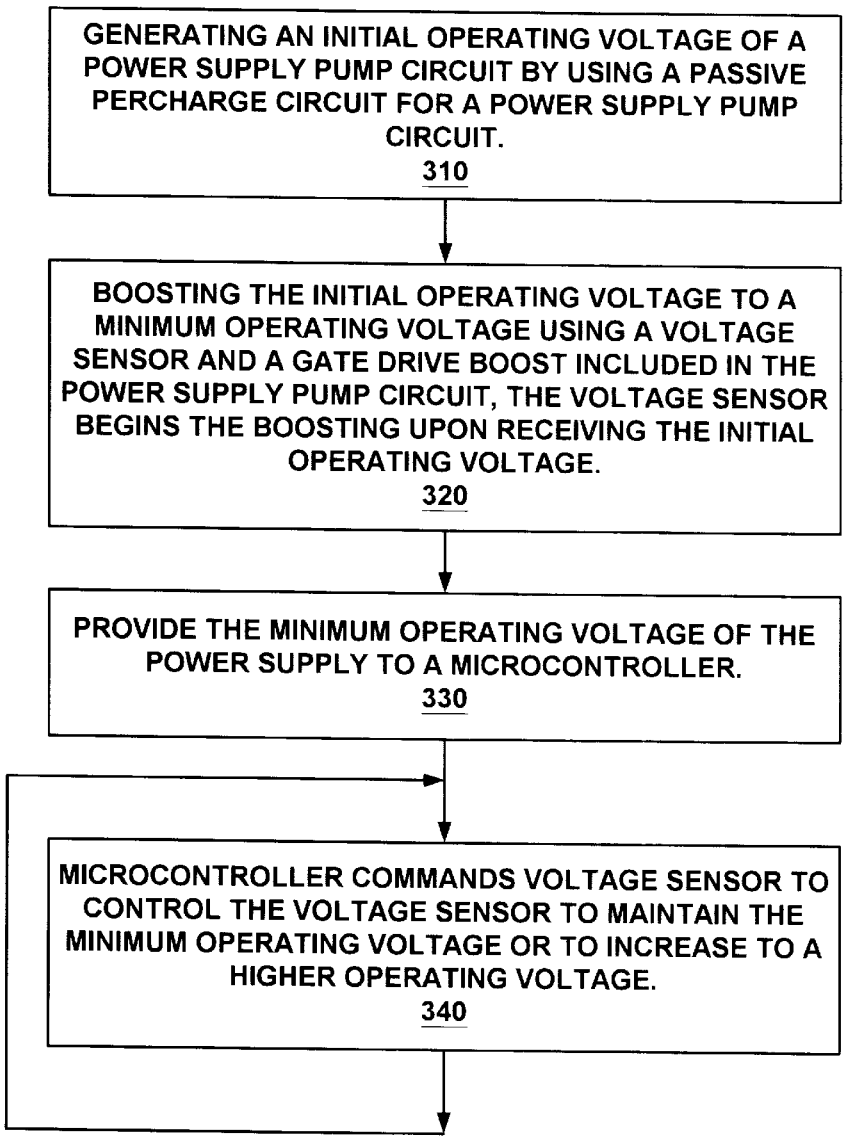
FIG. 3 is a flowchart of the steps in a process of initiating power supply pump operation and supplying the power requirements of a microcontroller.

FIG. 3 is a flowchart of the steps of a process 300 of initiating power supply pump operation and dynamic response to the power requirements of a microcontroller.

In step 310 of FIG. 3, the process 300 explains generation of an initial operating voltage of a power supply pump circuit by using a passive precharge circuit for a power supply pump circuit.

In step 320 of FIG. 3, the process 300 shows boosting the initial operating voltage to a minimum operating voltage using a voltage sensor included in the power supply pump circuit, the voltage sensor begins the boosting upon receiving the initial operating voltage.

In step 330 of FIG. 3, the system 300 provides the minimum operating voltage of the power supply to a microcontroller.

In step 340 of FIG. 3, this step of process 300 shows the microcontroller commanding the voltage sensor to maintain the minimum operating voltage or to increase the minimum operating voltage to a higher operating voltage.

Figure 4:
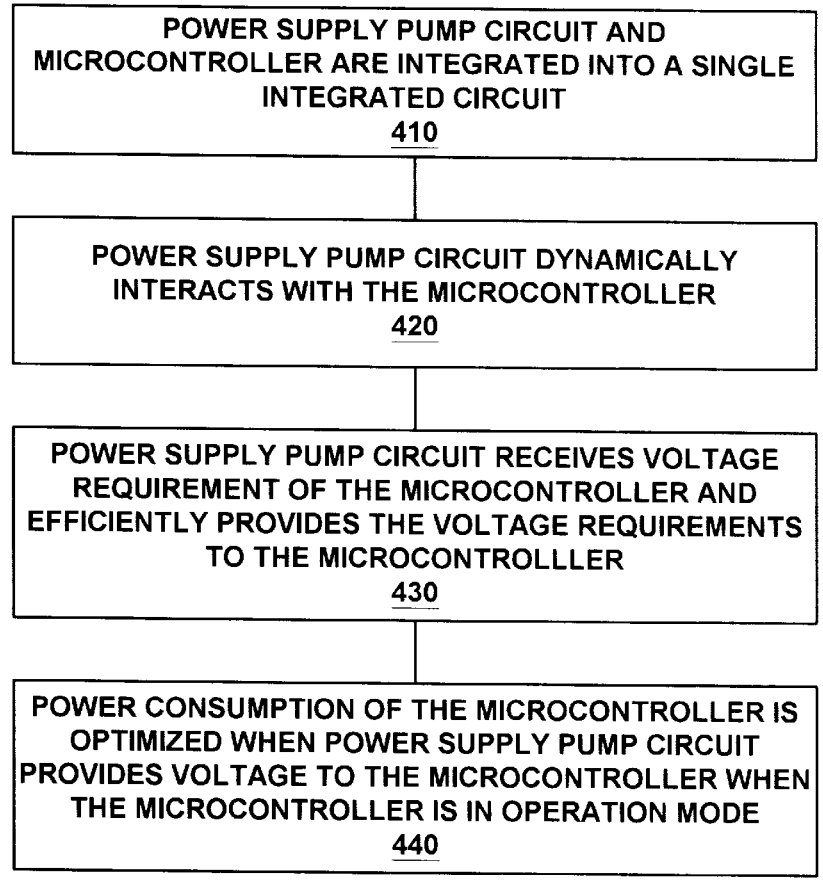
FIG. 4 is a flowchart of the steps in a process of a dynamic interaction the power supply pump circuit and a microcontroller.

FIG. 4 is a flowchart of the steps of a process 400 of initiating the power supply pump operation and a dynamic response to the power requirements of a microcontroller thus increasing the efficiency of the system.

In step 410 of FIG. 4, the power supply pump circuit and the microcontroller are integrated into a single integrated circuit.

In step 420 of FIG. 3, the power supply pump circuit dynamically interacts with the microcontroller.

In step 430 of FIG. 4, the power supply pump circuit receives a voltage requirement of the microcontroller and efficiently provides the voltage requirements to the microcontroller.

In step 440 of FIG. 4, the power consumption of the microcontroller is optimized when the power supply pump circuit provides voltage to the microcontroller when the microcontroller is in operation mode.

FIG. 5 is a flowchart of the steps of a process 500 of initiating a power supply pump operation and a dynamic response to the power requirements of a microcontroller, thus optimizing power consumption.

In step 510 of FIG. 5, initial operating voltage is generated by connecting a passive precharge circuit to a battery circuit.

In step 520 of FIG. 5, the initial operation of a drive enable circuit, a voltage sensor circuit, a ring oscillator circuit, and a gate drive boost circuit is initiated at the initial operating voltage.

In step 530 of FIG. 5, the operating voltage is boosted to a minimum operating voltage of microcontroller.

In step 540 of FIG. 5, system 500 shows monitoring the microcontroller's minimum operating voltage using a voltage sensor device and increasing the minimum operating voltage to a voltage level demanded by the microcontroller.

The foregoing descriptions of specific embodiments of the present invention have been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A power supply pump circuit for supplying power to a microcontroller comprising:
    a battery circuit comprising, an inductor, a battery, and a capacitor, said battery circuit is an off chip circuit;
    passive precharge circuit coupled to said battery circuit for causing said battery circuit to generate an initial operating voltage for a power supply of said microcontroller; and
    a voltage sensor circuit for boosting power supply from said initial operating voltage to a minimum operating voltage of said microcontroller, said voltage sensor configured to dynamically boost said power supply to a voltage higher than said minimum operating voltage in accordance with command from said microcontroller.

2. The power supply pump circuit of claim 1 further comprising:
    a drive enable circuit coupled to receive commands from said voltage sensor circuit;
    a gate drive boost circuit coupled to receive commands from said drive enable circuit to control said power supply voltage in accordance with said commands from said voltage sensor circuit, and
    a transistor controlled by said gate drive boost circuit, said transistor coupled to said battery circuit such that a duty cycle of said transistor controls said power supply voltage.

3. The power supply pump circuit of claim 2 further comprising a ring oscillator circuit for generating clock signal coupled to send said clock signals to said drive enable circuit, said gate drive boost circuit, and said voltage sensor circuit.

4. The power supply pump circuit of claim 2 wherein said voltage sensor circuit comprises a power on reset circuit storing a state said microcontroller is in at all times, said power on rest circuit notifies said voltage sensor to ramp said initial operating voltage to a minimum operating voltage of said microcontroller when said state being an initializing state.

5. The power supply pump circuit of claim 2 wherein said drive enable circuit coupled to said voltage sensor circuit for receiving power requirements from said microcontroller from said voltage sensor circuit and maintaining said power requirements of said microcontroller.

6. The power supply pump circuit of claim 2 wherein said battery circuit includes only one dry cell battery.

7. The power supply pump circuit of claim 3, wherein said initial operating voltage is 1 Volt.

8. The power supply pump circuit of claim 1, wherein said ring oscillator starts operating when said initial operating voltage is achieved.

9. A power supply pump circuit for supplying power to a microcontroller comprising:

a battery circuit comprising an inductor, a capacitor, a diode and a battery, said battery circuit coupled to a voltage sensor;

a passive precharge circuit initially coupled to said battery circuit, said battery circuit supplying power to said passive precharge circuit causing an initial operating voltage; and a Power On Rest circuit (POR), said POR circuit being a state dependent circuit memorizing a state of operation of said microcontroller, said POR circuit residing inside a voltage sensor and notifying said voltage sensor of said state of operation of said microcontroller, said voltage sensor coupled to a drive enable circuit and a gate drive boost circuit.

10. A power supply pump circuit of claim 9 wherein said microcontroller dynamically interacts with said power supply circuit when said initial operating voltage of said power supply pump circuit reaches a minimum operating voltage of said microcontroller.

11. A power supply pump circuit of claim 9 wherein said POR circuit communicates said state of operation of said microcontroller with said voltage sensor, said state being an initializing state or a wake up state, wherein said voltage sensor commands said drive enable to increase an initial operating voltage to a minimum operating voltage of said microcontroller.

12. A power supply pump circuit of claim 9 wherein said passive precharge circuit causes said capacitor to charge up to a level sufficient for said power supply pump circuit initial operation.

13. A power supply pump circuit of claim 9 wherein said microcontroller configures said voltage sensor circuit with desired parameters of said microcontroller when said minimum operating voltage is achieved.

14. A power supply pump circuit of claim 11 wherein said voltage sensor commands drive enable circuit a voltage level at least equal to a minimum operating voltage of said microcontroller if said state of said microcontroller received from said POR circuit is said initializing state.

15. A power supply pump circuit of claim 9 wherein said passive precharge circuit de-couples from said battery circuit when said initial operating voltage is achieved.

16. A power supply pump circuit of claim 9, wherein said microcontroller is in a sleep mode when said microcontroller is not in an operating mode, power requirements of said microcontroller in said sleep mode is less than one nano amp.

17. A power supply pump circuit for supplying power to a microcontroller comprising:

a passive precharge circuit, a voltage sensor circuit, a drive enable circuit, a gate drive boost circuit, a ring oscillator circuit and a transistor;

a battery circuit coupled to said passive precharge circuit;

said power supply pump circuit and said microcontroller residing in a single chip; and said power supply pump circuit and said microcontroller electrically coupled to a printed circuit board (PCB) through a single pin.

18. A power supply pump circuit of claim 17 wherein said battery circuit is an off chip circuit.

19. A power supply pump circuit of claim 17, wherein said passive precharge circuit and said drive enable circuit allow microcontroller entering a. low power sleep mode requiring one nano amp or below.

20. A power supply pump circuit of claim 17 wherein said passive precharge circuit being electrically decoupled from said power supply pump circuit.

21. A power supply pump circuit of claim 17 wherein said circuit interfaces with a plurality of input and output pins.

* * * * *